(12) United States Patent
Makiyama

(10) Patent No.: US 10,217,829 B2
(45) Date of Patent: Feb. 26, 2019

(54) COMPOUND SEMICONDUCTOR DEVICE INCLUDING DIFFUSION PREVENTING LAYER TO SUPPRESS CURRENT COLLAPSE PHENOMENON, METHOD OF MANUFACTURING COMPOUND SEMICONDUCTOR DEVICE, POWER SUPPLY UNIT, AND AMPLIFIER

(71) Applicant: FUJITSU LIMITED, Kawasaki-shi, Kanagawa (JP)

(72) Inventor: Kozo Makiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/685,063

(22) Filed: Aug. 24, 2017

(65) Prior Publication Data

US 2018/0090577 A1    Mar. 29, 2018

(30) Foreign Application Priority Data

Sep. 29, 2016 (JP) .................................. 2016-191599

(51) Int. Cl.
*H01L 29/205* (2006.01)
*H01L 29/40* (2006.01)
(Continued)

(52) U.S. Cl.
CPC ...... *H01L 29/408* (2013.01); *H01L 21/02241* (2013.01); *H01L 23/3107* (2013.01); *H01L 29/205* (2013.01); *H01L 29/66462* (2013.01); *H01L 29/7786* (2013.01); *H01L 29/7787* (2013.01); *H03F 1/3247* (2013.01); *H03F 3/195* (2013.01); *H03F 3/1935* (2013.01); *H03F 3/245* (2013.01); *H01L 21/0217* (2013.01); *H01L 21/0254* (2013.01); *H01L 21/0262* (2013.01); *H01L 21/0277* (2013.01); (Continued)

(58) Field of Classification Search
CPC ............ H01L 29/408; H01L 29/66462; H01L 29/2003; H01L 29/205; H01L 21/02241; H01L 29/7787; H01L 23/49562; H01L 21/02211; H01L 21/0277; H01L 21/0254; H01L 21/02458; H03F 3/1935; H03F 2200/451
See application file for complete search history.

(56) References Cited

U.S. PATENT DOCUMENTS 8,957,425 B2 * 2/2015 Yamada ............ H01L 21/28264
257/194
8,969,919 B2 * 3/2015 Ohki ..................... H01L 23/291
257/192

(Continued)

FOREIGN PATENT DOCUMENTS

JP    2007-150106    6/2007
JP    2011-204717    10/2011

*Primary Examiner* — Bilkis Jahan
(74) *Attorney, Agent, or Firm* — Fujitsu Patent Center

(57) ABSTRACT

A compound semiconductor device disclosed herein includes a substrate, an electron transit layer formed on the substrate, a compound semiconductor layer containing gallium and formed on the electron transit layer, a diffusion preventing layer containing gallium oxide and formed on the compound semiconductor layer, an insulation layer formed on the diffusion preventing layer, and a source electrode, a drain electrode, and a gate electrode formed over the electron transit layer at a distance from one another.

11 Claims, 20 Drawing Sheets

(51) Int. Cl.
*H01L 21/02* (2006.01)
*H01L 29/66* (2006.01)
*H01L 29/778* (2006.01)
*H03F 3/193* (2006.01)
*H03F 1/32* (2006.01)
*H03F 3/195* (2006.01)
*H03F 3/24* (2006.01)
*H01L 23/31* (2006.01)
H01L 21/027 (2006.01)
H01L 21/306 (2006.01)
H01L 21/311 (2006.01)
H01L 23/495 (2006.01)
H01L 29/20 (2006.01)
H02M 1/42 (2007.01)
H02M 5/458 (2006.01)
H03F 3/21 (2006.01)
H01L 29/417 (2006.01)
H01L 29/423 (2006.01)

(52) U.S. Cl.
CPC ... *H01L 21/02211* (2013.01); *H01L 21/02274* (2013.01); *H01L 21/02458* (2013.01); *H01L 21/30621* (2013.01); *H01L 21/31116* (2013.01); *H01L 21/31144* (2013.01); *H01L 23/3114* (2013.01); *H01L 23/4952* (2013.01); *H01L 23/49513* (2013.01); *H01L 23/49562* (2013.01); *H01L 29/2003* (2013.01); *H01L 29/41766* (2013.01); *H01L 29/42376* (2013.01); *H02M 1/4208* (2013.01); *H02M 5/4585* (2013.01); *H03F 1/3205* (2013.01); *H03F 1/3241* (2013.01); *H03F 3/21* (2013.01); *H03F 2200/451* (2013.01)

(56) References Cited

U.S. PATENT DOCUMENTS 9,755,061 B2 * 9/2017 Ozaki .................. H01L 29/513
2011/0233538 A1 9/2011 Iwakami et al.
2014/0264451 A1 * 9/2014 Ozaki .................. H01L 29/513
257/194

* cited by examiner

COMPOUND SEMICONDUCTOR DEVICE INCLUDING DIFFUSION PREVENTING LAYER TO SUPPRESS CURRENT COLLAPSE PHENOMENON, METHOD OF MANUFACTURING COMPOUND SEMICONDUCTOR DEVICE, POWER SUPPLY UNIT, AND AMPLIFIER

CROSS-REFERENCE TO RELATED APPLICATION(S)

This application is based upon and claims the benefit of priority of the prior Japanese Patent Application No. 2016-191599, filed on Sep. 29, 2016, the entire contents of which are incorporated herein by reference.

FIELD

The embodiments discussed herein are related to a compound semiconductor device, a method of manufacturing a compound semiconductor device, a power supply unit, and an amplifier.

BACKGROUND

There are various types of compound semiconductor devices. Among them, a high electron mobility transistor (HEMT) has advantages of low noise and high speed operation, and is used in an application such as a base station for mobile telephones by exploiting these advantages.

In the HEMT, a two-dimensional electron gas induced in an electron transit layer serves as a carrier. While there are various materials for the material of the electron transit layer, the use of a nitride semiconductor material such as GaN as a material for the electron transit layer can enhance a withstand voltage of the HEMT by a large bandgap inherent to the nitride semiconductor.

In order to induce the two-dimensional electron gas in a GaN layer of the electron transit layer, an AlGaN layer which has different lattice constant and different spontaneous polarization than those of the GaN layer may be formed on the GaN layer. In this case, distortion occurs in AlGaN layer due to the lattice constant difference between the layers. Due to this distortion, piezoelectric polarization and spontaneous polarization occurs in AlGaN layer, which in turn induces the two-dimensional electron gas in the GaN layer of the electron transit layer.

However, under some circumstances, a current collapse phenomenon occurs in the HEMT that uses nitride semiconductor.

The current collapse phenomenon is a phenomenon in which on-resistance is raised along with an increase in source-drain voltage, and a drain current is little increased as a consequence. The current collapse phenomenon is one of factors that inhibit the higher output of the HEMT.

SUMMARY

According to one aspect discussed herein, there is provided a compound semiconductor device including a substrate, an electron transit layer formed on the substrate, a compound semiconductor layer containing gallium and formed on the electron transit layer, a diffusion preventing layer containing gallium oxide and formed on the compound semiconductor layer, an insulation layer formed on the diffusion preventing layer, and a source electrode, a drain electrode, and a gate electrode formed over the electron transit layer at a distance from one another.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Prior to describing embodiments, matters examined by the inventor of the present application will be discussed.

Figure 1:
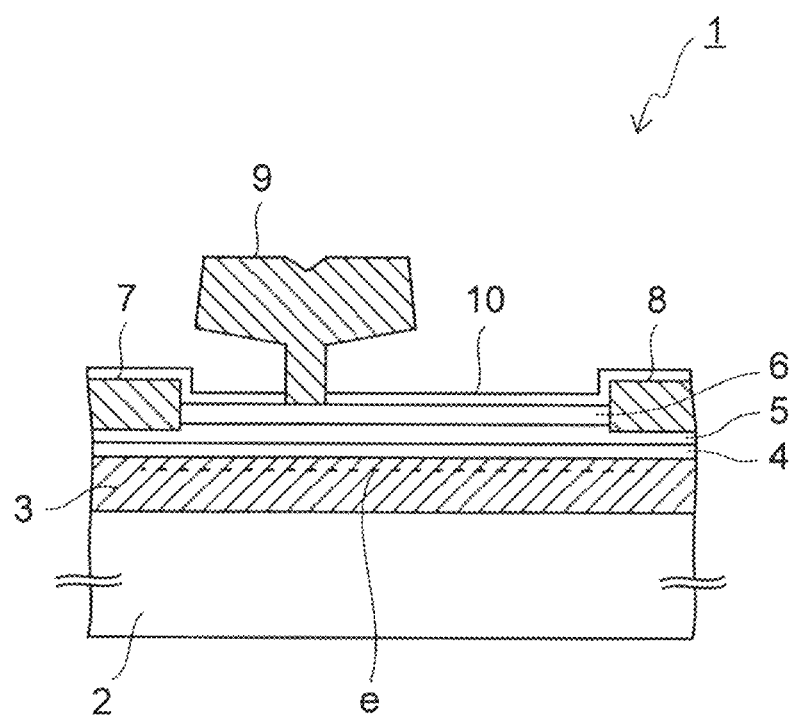
FIG. 1 is a cross-sectional view of a compound semiconductor device used for examination.

FIG. 1 is a cross-sectional view of a compound semiconductor device used for the examination.

This compound semiconductor device 1 is a HEMT which includes a SiC substrate 2, and a GaN electron transit layer 3 formed thereon. Here, a buffer layer including a nucleation layer may be formed between the SiC substrate 2 and the electron transit layer 3.

A source electrode 7 and a drain electrode 8 are formed over the electron transit layer 3 at a distance from each other.

Then, an intermediate layer 4, a barrier layer 5, and a cap layer 6 are formed in this order on the electron transit layer 3 between the source electrode 7 and the drain electrode 8.

Among them, the intermediate layer 4 has a role of preventing a surface of the electron transit layer 3 from getting rough after forming the electron transit layer 3. In this example, an AlN layer is formed as the intermediate layer 4.

Meanwhile, the barrier layer 5 is an AlGaN layer, which has different lattice constant than that of the electron transit layer 3, and barrier is formed between the AlGaN layer and electron transit layer 3. Piezoelectric polarization or spontaneous polarization occurs due to the difference in lattice constant or a difference in spontaneous polarization, which induces a two-dimensional electron gas e in the electron transit layer 3. The two-dimensional electron gas e functions as a carrier, and is accumulated in a portion of the electron transit layer 3 located close to the intermediate layer 4.

Then, the cap layer 6 is provided in order to prevent aluminum contained in the barrier layer 5 from being oxidized and to weaken electric fields. In this example, a GaN layer is formed as the cap layer 6.

In addition, a gate electrode 9 and an insulation layer 10 are formed on the cap layer 6. The insulation layer 10 plays a role of protecting the compound semiconductor device 1 against moisture and the like in the atmosphere. In this example, a silicon nitride film having an excellent moisture-proof function is formed as the insulation layer 10.

In the above-described compound semiconductor device 1, nitride semiconductor is used as a material of the barrier layer 5 and the cap layer 6. In this case, the current collapse phenomenon occurs in the compound semiconductor device 1 as mentioned previously.

In order to determine the cause of the current collapse phenomenon, the inventor of the present application observed the compound semiconductor device 1 with a transmission electron microscope (TEM).

Figure 2:
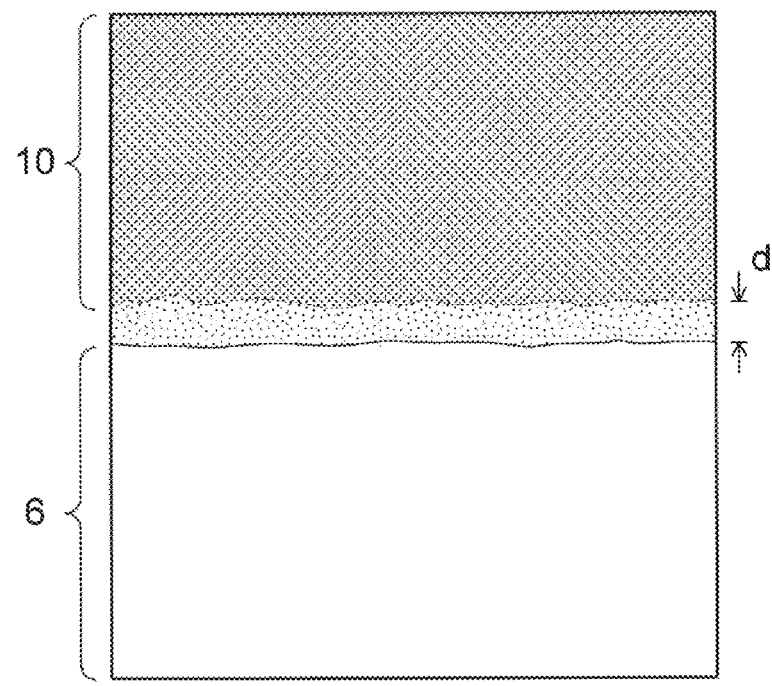
FIG. 2 is a diagram drawn on the basis of a TEM image of the compound semiconductor device used for the examination.

FIG. 2 is a diagram drawn on the basis of the TEM image.

In this example, an interface between the cap layer 6 and the insulation layer 10 was observed with the TEM.

As illustrated in FIG. 2, the interface is slightly blurred. This is thought to be because gallium atoms in the GaN layer formed as the cap layer 6 are diffused into the silicon nitride film formed as the insulation layer 10. A diffusion length d thereof is about 3 nm from a surface of the cap layer 6.

When the gallium atoms are diffused in this manner, the gallium atoms become deficient in the cap layer 6, and the Ga—N bonding is destroyed in the cap layer 6. Moreover, in the insulation layer 10, the Si—N bonding is destroyed by the diffused gallium atoms from the cap layer 6. A portion where the Ga—N bonding or the Si—N bonding is destroyed functions as an electron trap. Therefore, electrons trapped by such electron traps cause charge-up in the vicinity of the interface between the cap layer 6 and the insulation layer 10.

Due to the charge-up (electron trap), a conduction band is raised and an electron concentration is reduced. This is thought to be a reason of occurrence of the above-mentioned current collapse phenomenon.

Therefore, in order to suppress the current collapse phenomenon, it is considered effective to prevent the gallium atoms from being diffused into the insulation layer 10.

In view of these findings, the inventor of the present application conceived of the following embodiments.

(First Embodiment)

A compound semiconductor device according to a first embodiment will be described while illustrating a manufacturing process thereof.

Figure 3A:
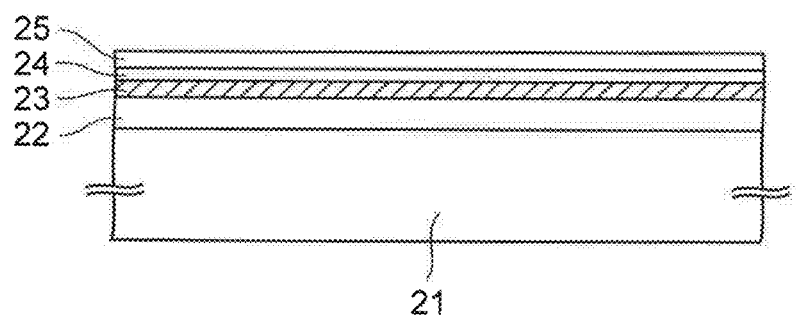
FIGS. 3A to 3N are cross-sectional views in the process of manufacturing a compound semiconductor device according to a first embodiment.
Figure 3B:
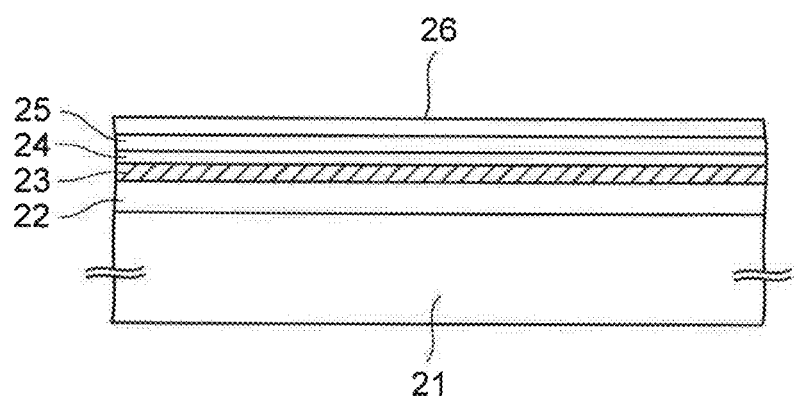
Figure 3C:
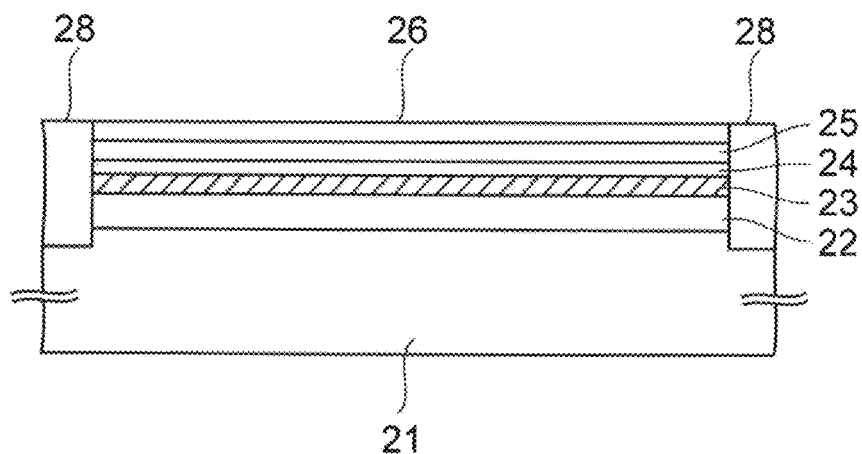
Figure 3D:
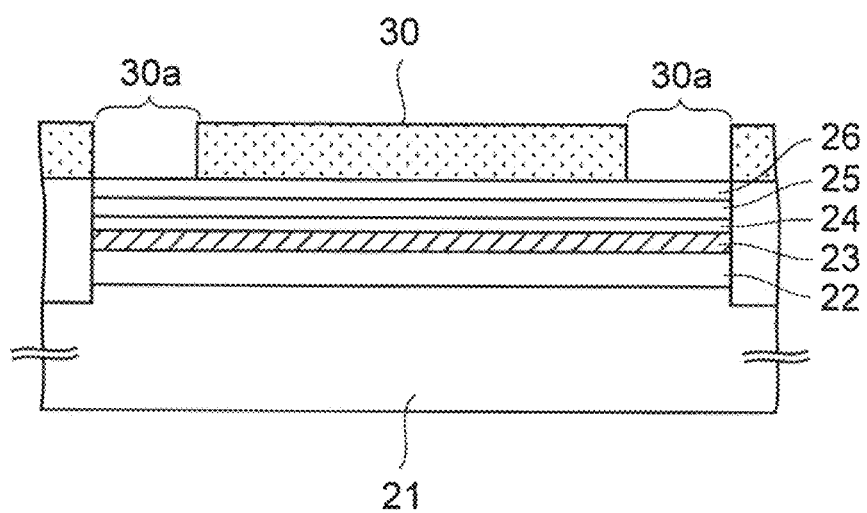
Figure 3E:
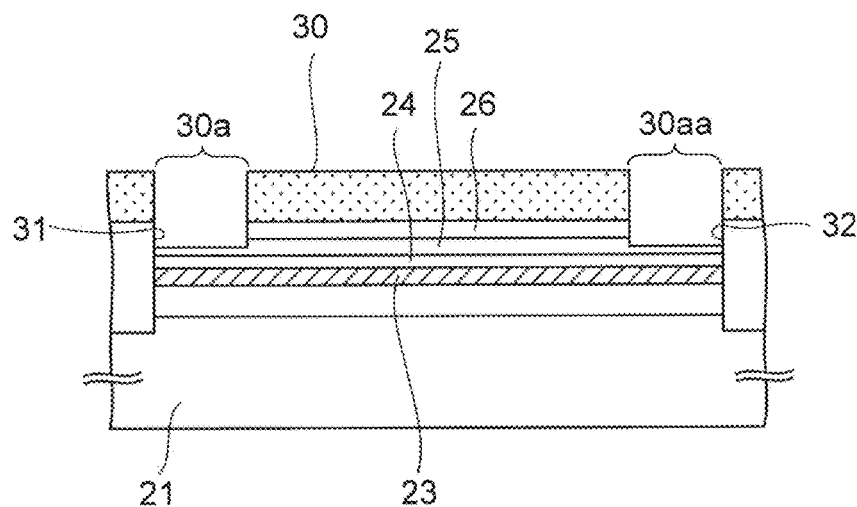
Figure 3F:
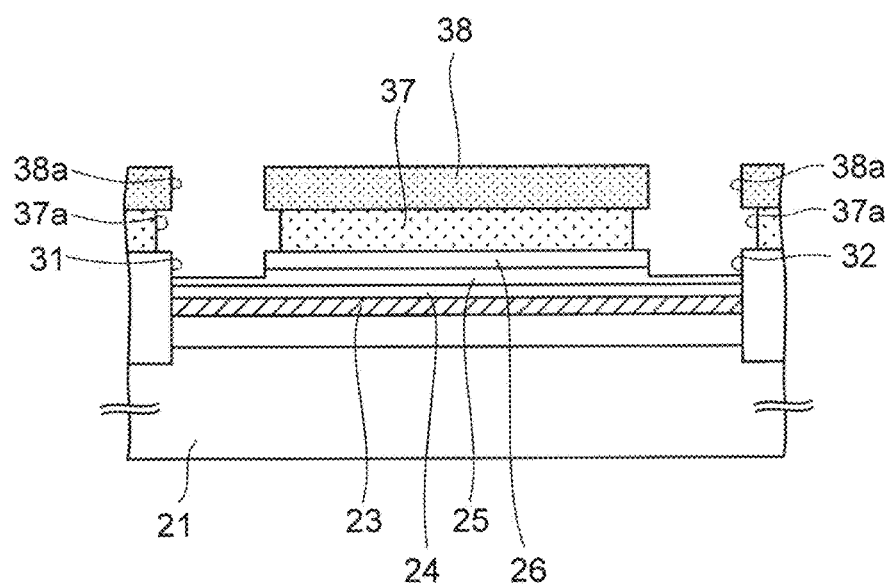
Figure 3G:
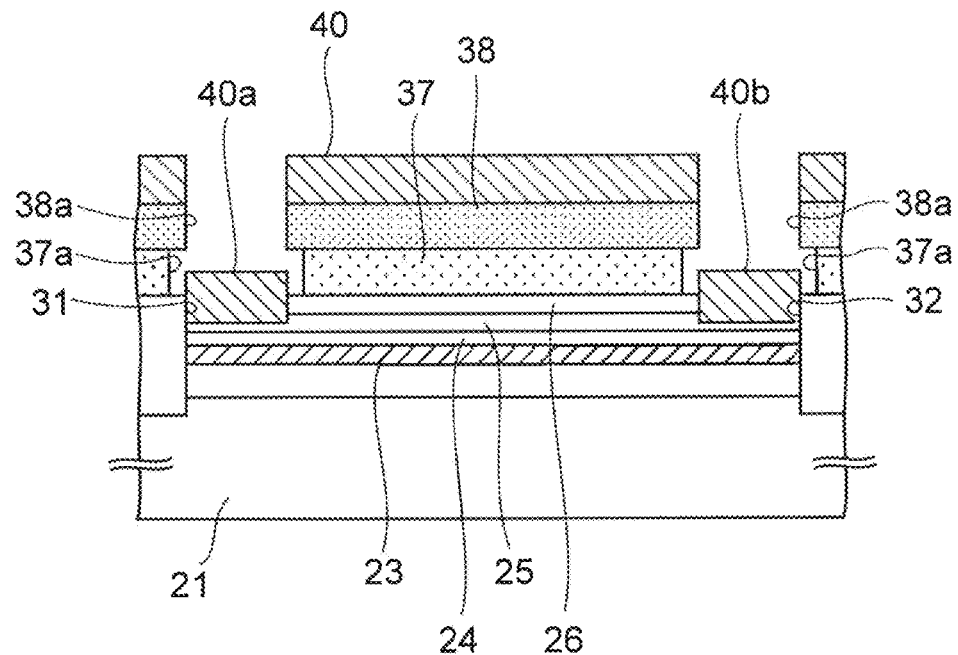
Figure 3H:
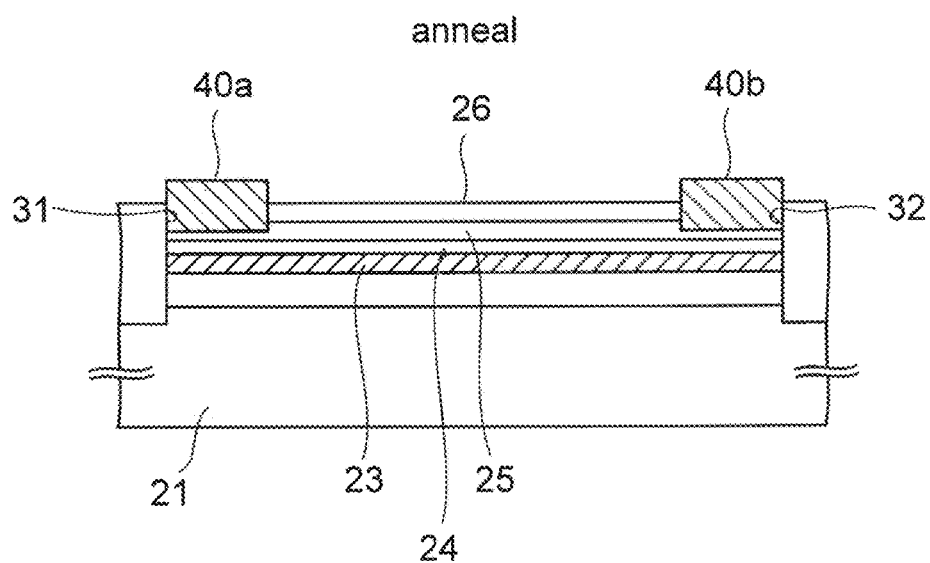
Figure 3I:
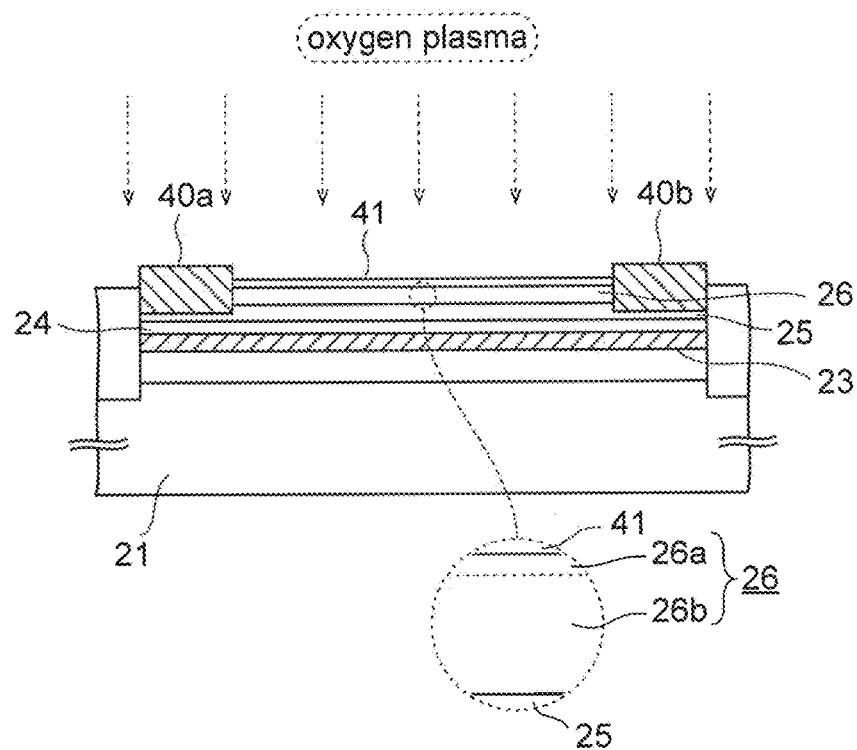
Figure 3J:
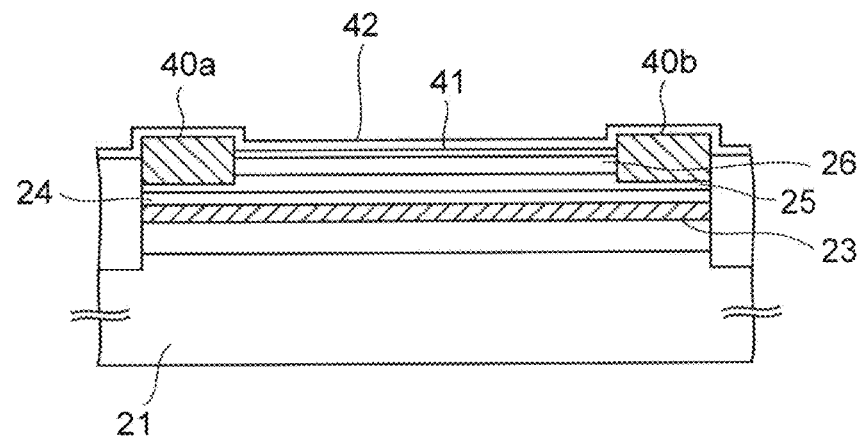
Figure 3K:
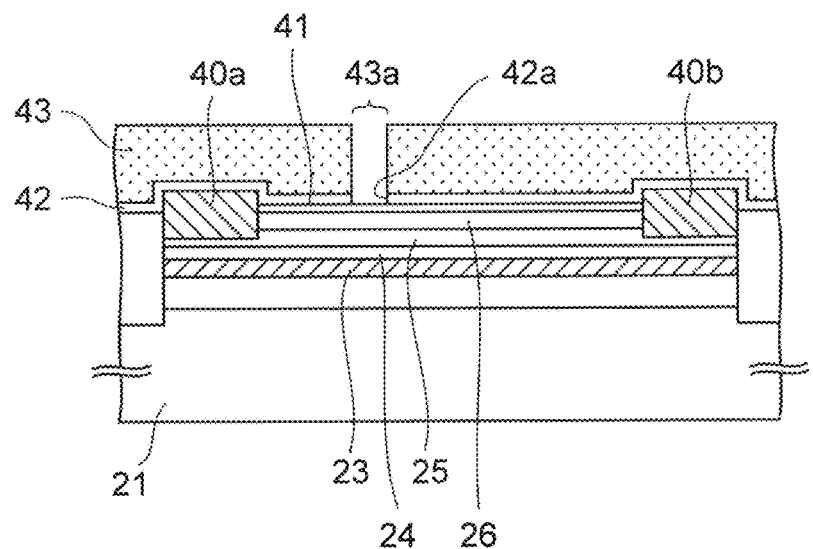
Figure 3L:
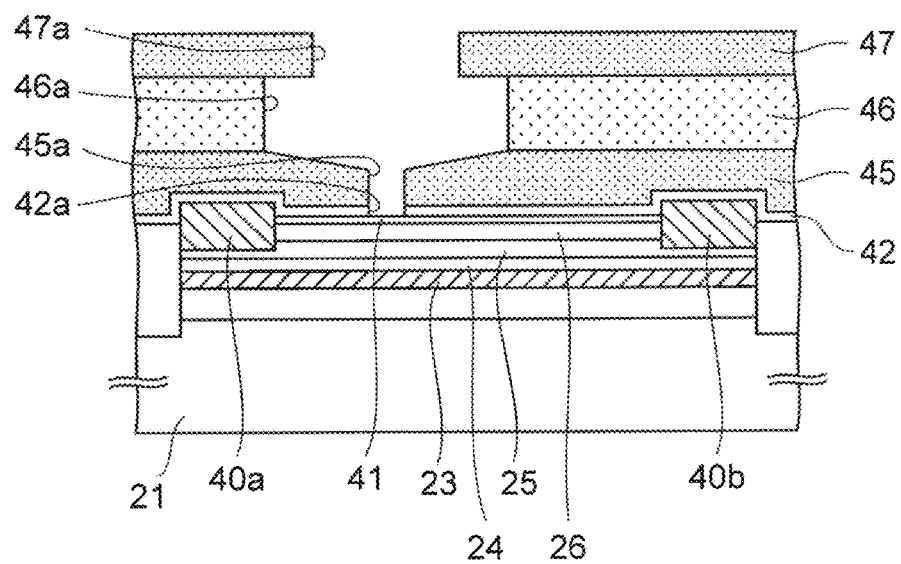
Figure 3M:
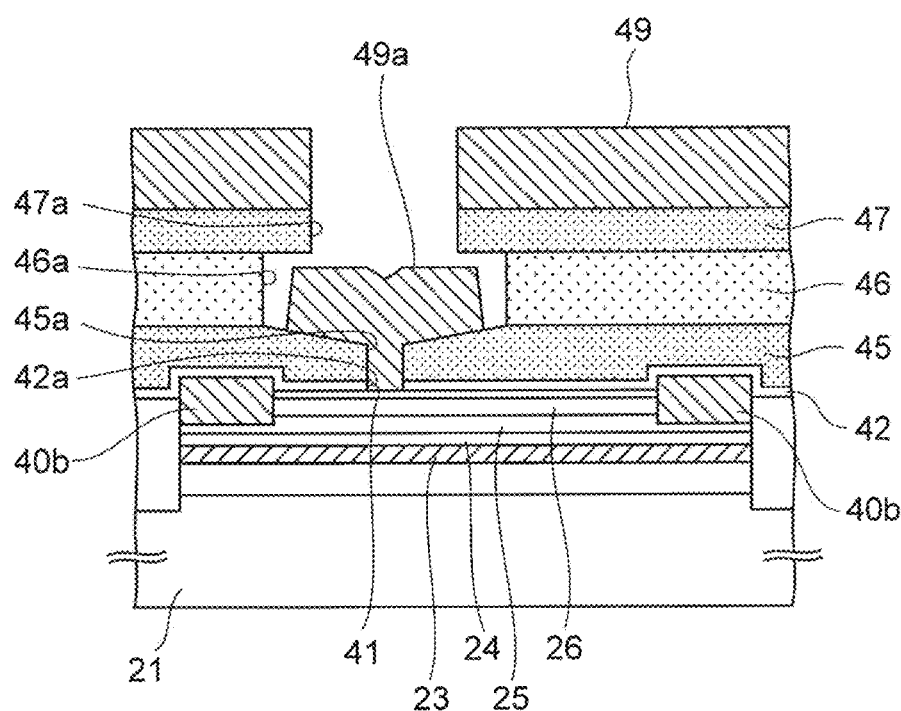
Figure 3N:
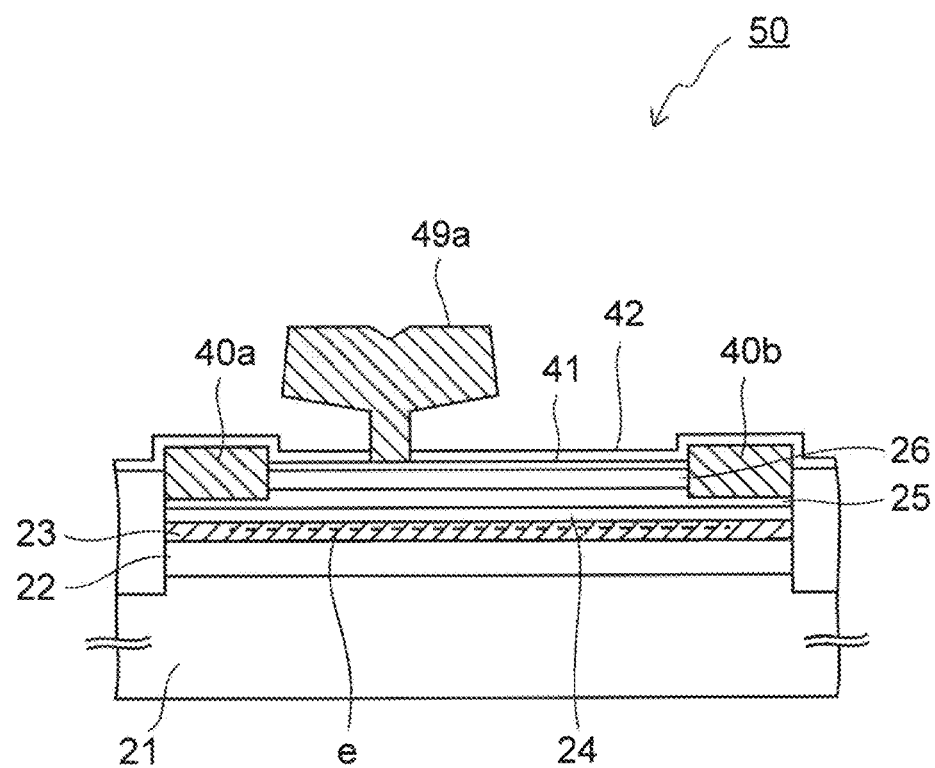

FIGS. 3A to 3N are cross-sectional views in the process of manufacturing the compound semiconductor device of the present embodiment. In the present embodiment, a HEMT is manufactured as the compound semiconductor device as follows.

First, as illustrated in FIG. 3A, a semi-insulating SiC substrate is prepared as a substrate 21, and a gallium nitride (GaN) layer is formed thereon to a thickness of about 1 μm as a buffer layer 22 by metal organic vapor phase epitaxy (MOVPE).

Here, an AlN nucleation layer may be formed in advance on the substrate 21 before forming the buffer layer 22, and then the buffer layer 22 may be formed on the AlN nucleation layer.

Thereafter, a GaN layer is formed to a thickness of about 100 nm as an electron transit layer 23 on the buffer layer 22 by the MOVPE. While there is a difference in lattice constant between the substrate 21 and the electron transit layer 23, the buffer layer makes it possible to relax a lattice mismatch between the compound semiconductor substrate 21 and the electron transit layer 23.

Deposition conditions for the electron transit layer 23 are not particularly limited. In the present embodiment, the electron transit layer 23 is formed by using a mixed gas of trimethylgallium (TMG) gas, ammonia ($NH_3$) gas, and hydrogen ($H_2$) gas as a deposition gas and setting a substrate temperature to about 1000° C. to 1200° C.

In this embodiment, after forming the electron transit layer 23, a surface of the electron transit layer 23 is covered with an intermediate layer while maintaining the substrate temperature in a range from about 1000° C. to 1200° C.

The intermediate layer 24 is an AlN layer with a thickness of about 1 nm formed by the MOVPE.

Mobility of the HEMT is improved by covering the electron transit layer 23 with the intermediate layer 24 in this manner.

Thereafter, an aluminum gallium nitride (AlGaN) layer is formed to a thickness of about 5 nm to 15 nm as a barrier layer 25 on the intermediate layer by the MOVPE. A deposition gas for the barrier layer 25 is a mixed gas of trimethylaluminum (TMA) gas, TMG gas, ammonia gas, and hydrogen gas, for example.

Here, in order to induce a high-concentration two-dimensional electron gas in the electron transit layer 23 by enhancing spontaneous polarization of the barrier layer 25, an InAlGaN layer may be formed as the barrier layer 25 by mixing trymethylindium (TMI) gas with the above-mentioned deposition gas. The InAlGaN layer is formed at a lower temperature than the temperatures for forming the electron transit layer 23 and the intermediate layer 24.

Next, as illustrated in FIG. 3B, a GaN layer is formed to a thickness of about 1 nm to 10 nm on the barrier layer 25 by the MOVPE, and the GaN layer is used as a cap layer 26.

By the cap layer 26, it is possible to prevent aluminum contained in the barrier layer 25 from being oxidized by oxygen in the atmosphere, and to weaken an electric field as well.

Note that the cap layer 26 is an example of a compound semiconductor layer.

Subsequently, as illustrated in FIG. 3C, device isolation regions 28 are formed by implanting argon ions from a surface of the cap layer 26 toward the substrate 21, and active regions are defined by the device isolation regions 28.

Next, as illustrated in FIG. 3D, a first resist layer 30 is coated on the cap layer 26, and two openings 30a are formed at a distance from each other in the first resist layer 30 by subjecting the first resist layer 30 to exposure and development.

Then, as illustrated in FIG. 3E, the cap layer 26 and part of the barrier layer 25 are subjected to dry etching through the openings 30a, respectively. Thus, a first opening 31 and a second opening 32 each reaching a halfway depth of the barrier layer 25 are formed at a distance from each other.

An etching gas used in this dry etching is not particularly limited. For example, a mixed gas of an inert gas and chlorine ($Cl_2$) gas may be used as the etching gas.

Thereafter, the first resist layer 30 is removed by using a heated organic solvent.

Subsequently, as illustrated in FIG. 3F, a second resist layer 37 and a third resist layer 38 are formed in this order on the entire upper surface of the substrate 21. In this example, PMGI manufactured by MicroChem Corp. is used as a material of the second resist layer 37, and ZEP520 manufactured by Zeon Corporation is used as a material of the third resist layer 38.

Then, after the third resist layer 38 is subjected to exposure to an electron beam, the third resist layer 38 is developed by using ZEP-SD manufactured by Zeon Corporation. Thus, openings 38a are formed over the first opening 31 and the second opening 32, respectively.

Moreover, the second resist layer 37 is subjected to wet etching through the openings 38a. Thus, openings 37a having side surfaces set back from the openings 38a are formed in the second resist layer 37. Examples of an etching solution usable in the wet etching include NMD-W manufactured by Tokyo Ohka Kogyo Co., Ltd.

Although the third resist layer 38 is subjected to exposure to the electron beam in this example, an i-line resist layer may be formed as the third resist layer 38, and the third resist layer 38 may be subjected to exposure to the i-line instead. Examples of the i-line resist layer include PFI-32A manufactured by Sumitomo Chemical Co., Ltd.

Subsequently, as illustrated in FIG. 3G, a titanium layer with a thickness of about 20 nm and an aluminum layer with a thickness of about 200 nm are formed in this order by vapor deposition as a metal lamination film 40 on the third resist layer 38 and on the barrier layer 25 exposed from the openings 31 and 32.

Thereafter, the second resist layer 37 and the third resist layer 38 are lifted off. In this way, portions of the metal lamination film 40 formed in the openings 31 and 32 are made into a source electrode 40a and a drain electrode 40b arranged at a distance from each other.

At this time, since the side surfaces of the openings 37a are set back from the openings 38a as mentioned previously, it is possible to separate the source electrode 40a and the drain electrode 40b from the metal lamination film 40 on the third resist layer 38, and thus to prevent the metal lamination film 40 from being left over after the liftoff.

Next, as illustrated in FIG. 3H, the source electrode 40a and the drain electrode 40b are heated under a condition of the substrate temperature of about 550° C. in a nitrogen atmosphere. Thus, the material of the source electrode 40a and the drain electrode 40b is diffused into the electron transit layer 23, so that the source electrode 40a and the drain electrode 40b can be brought into ohmic contact with the electron transit layer 23, respectively.

Next, a process illustrated in FIG. 3I will be described.

First, the substrate 21 is put into an unillustrated asking chamber. Then, oxygen gas is supplied into the chamber and an oxygen plasma atmosphere is created by applying high-frequency electricity of a frequency of 13.56 MHz and a power of 200 W to the oxygen gas.

Thereafter, the surface of the cap layer 26 is exposed to the plasma atmosphere for about three minutes. Thus, gal-lium in the surface layer of the cap layer 26 is oxidized to form a diffusion preventing layer 41 of gallium oxide to a thickness of about 1 nm to 2 nm.

At the time of the oxidation, the gallium atoms in an upper layer 26a of the cap layer 26 located close to the diffusion preventing layer 41 are consumed. As a consequence, the gallium atoms become insufficient in the upper layer 26a, whereby a composition ratio of gallium in the upper layer 26a becomes smaller than that in a stoichiometric composition.

On the other hand, the gallium atoms in a lower layer 26b of the cap layer 26 are not consumed. Accordingly, the composition ratio of gallium in the upper layer 26a becomes smaller than a composition ratio of gallium in the lower layer 26b.

Note that the method of forming the diffusion preventing layer 41 is not limited to the above. For example, the gallium oxide layer may be formed as the diffusion preventing layer 41 by metal organic chemical vapor deposition (MOCVD) or by the MOVPE. Alternatively, the diffusion preventing layer 41 may be formed by oxidizing the surface of the cap layer 26 by exposing the surface of the cap layer 26. These are also the case for a second embodiment to be described later.

Subsequently, as illustrated in FIG. 3J, a silicon nitride layer of a thickness of about 50 nm is formed on the source electrode 40a, the drain electrode 40b, and the diffusion preventing layer 41 as an insulation layer 42 for protecting a surface of a device against moisture in the atmosphere. The silicon nitride layer has a stoichiometric composition and its refraction index is about 2.0 with respect to light at a wavelength of 633 nm.

This silicon nitride layer may be formed by plasma CVD which uses silane ($SiH_4$) gas and ammonia gas as a deposition gas, for example.

The insulation layer 42 is not limited to the silicon nitride layer. Instead of the silicon nitride layer, any of a silicon oxynitride layer, a silicon oxide layer, an aluminum nitride layer, an aluminum oxide layer, an aluminum oxynitride layer, and a hafnium oxide layer may be formed as the insulation layer 42.

Next, as illustrated in FIG. 3K, PMMA manufactured by MicroChem Corp. is coated as a fourth resist layer 43 on the insulation layer 42, and is subjected to exposure to an electron beam and then developed. In this way, an opening 43a having a diameter of about 0.1 μm is formed in the fourth resist layer 43.

Then, the insulation layer 42 is subjected to dry etching through the opening 43a while using $SF_6$ gas as an etching gas. Thus, an opening 42a is formed in a portion of the insulation layer 42 between the source electrode 40a and the drain electrode 40b such that the diffusion preventing layer 41 is exposed from the opening 42a.

Thereafter, the fourth resist layer 43 is removed.

Subsequently, as illustrated in FIG. 3L, fifth to seventh resist layers 45 to 47 are formed in this order on the insulation layer 42.

Materials of the resist layers 45 to 47 are not particularly limited. In this example, PMMA manufactured by MicroChem Corp. is used as a material of the fifth resist layer 45, and PMGI manufactured by MicroChem Corp. is used as a material of the sixth resist layer 46. Moreover, ZEP520 manufactured by Zeon Corporation is used as a material of the seventh resist layer 47.

Then, after the seventh resist layer 47 is subjected to exposure to an electron beam, the seven resist layer 47 is developed by using the developer ZEP-SD manufactured by Zeon Corporation. Thus, an opening 47a having a width of about 0.8 µm is formed in the seventh resist layer 47.

Thereafter, the sixth resist layer 46 is subjected to wet etching through the opening 47a. Thus, an opening 46a having a side surface set back by 0.5 µm from the opening 47a is formed in the sixth resist layer 46. For example, NMD-W manufactured by Tokyo Ohka Kogyo Co., Ltd. is used as an etching solution in this wet etching.

Furthermore, after the fifth resist layer 45 exposed from the opening 46a is subjected to exposure to an electron beam, the fifth resist layer 45 is developed by using a developer ZMD-B manufactured by Zeon Corporation. Thus, an opening 45a having a diameter of about 0.15 µm is formed over the opening 42a.

Next, as illustrated in FIG. 3M, a nickel layer of a thickness of about 10 nm and a gold layer of a thickness of about 300 nm are formed in this order by vapor deposition as a metal lamination film 49 on the seventh resist layer 47.

The metal lamination film 49 is also formed in the opening 45a as well as the respective openings 46a and 47a. Thus, a gate electrode 49a having a shape of a mushroom is formed on the cap layer 26 exposed from the opening 42a, and the gate electrode 49a locates at a distance from the source electrode 40a and the drain electrode 40b.

Thereafter, as illustrated in FIG. 3N, the resist layers 45 to 47 are dissolved and removed by using a heated organic solvent.

In this way, a basic structure of a compound semiconductor device 50 of the present embodiment is obtained.

In this compound semiconductor device 50, a two-dimensional electron gas e is generated as a carrier in the electron transit layer 23 by piezoelectric polarization and spontaneous polarization of the barrier layer 25.

According to the present embodiment, the gallium oxide layer is formed as the diffusion preventing layer 41 between the GaN cap layer 26 and the silicon nitride insulation layer 42.

Since the Ga—O bonding in the gallium oxide layer is stronger than the Ga—N bonding, it is possible to inhibit the gallium atoms from being diffused into the insulation layer 42.

As a consequence, it is possible to suppress occurrence of the electron traps in the cap layer 26 and the insulation layer 42 due to the diffusion of gallium atoms, and to suppress occurrence of a current collapse attributed to the electron traps.

Here, since silane is used in the deposition gas for the insulation layer 42 as described above, the insulation layer 42 includes the Si—H bonding and the N—H bonding attributed to hydrogen atoms in silane. In the present embodiment, the diffusion preventing layer 41 has a function to prevent diffusion of the gallium atoms as described above. Accordingly, the gallium atoms are prevented from being incorporated into the insulation layer 42, which may otherwise occur when the constituent atoms of Si—H bonding and the N—H bonding are replaced by gallium atom.

The inventor of the present application observed the compound semiconductor device 50 with the TEM in order to verify that the diffusion of the gallium atoms is suppressed by the diffusion preventing layer 41.

Figure 4:
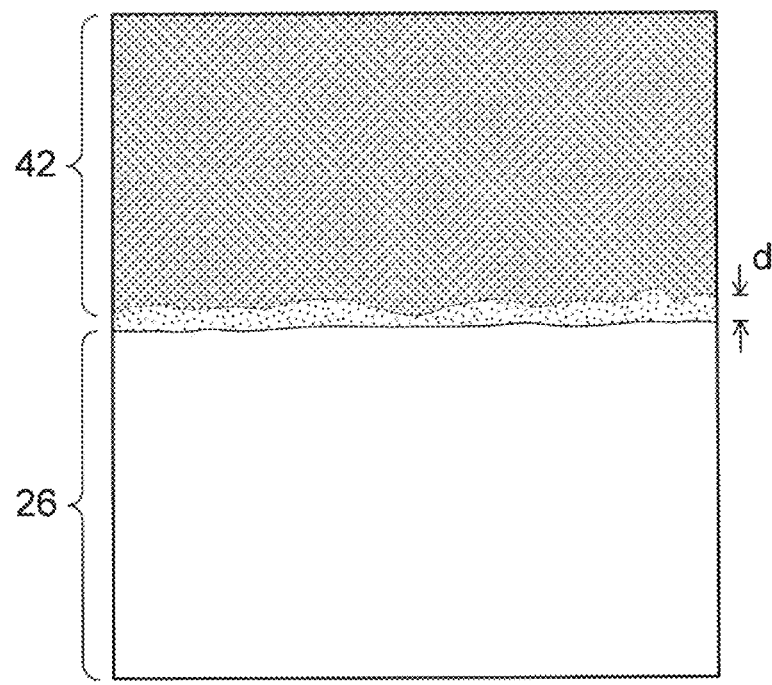
FIG. 4 is a diagram drawn on the basis of a TEM image of the compound semiconductor device according to the first embodiment.

FIG. 4 is a diagram drawn on the basis of the TEM image.

In this example, an interface between the cap layer 26 and the insulation layer 42 was observed with the TEM.

As illustrated in FIG. 4, in the present embodiment, a boundary between the cap layer 26 and the insulation layer 42 appears more clearly than in the example of FIG. 2. Thus, diffusion of the gallium atoms from the cap layer 26 into the insulation layer 42 is suppressed. Here, a diffusion length d of the gallium atoms is equal to or below 2 nm, which is shorter than that in the example in FIG. 2.

According to this result, it was confirmed that the diffusion preventing layer 41 is effective for suppressing diffusion of the gallium atoms.

Moreover, the inventor of the present application measured three-terminal characteristics of the compound semiconductor device 50 of the present embodiment in order to verify that the current collapse phenomenon is suppressed in the present embodiment.

The result of the measurement will be described with reference to FIGS. 5A and 5B.

Figure 5A:
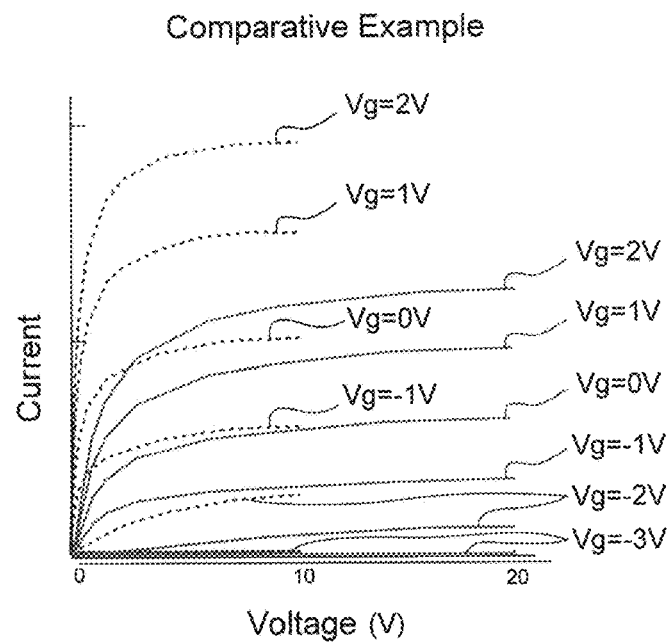
FIG. 5A is a graph illustrating a result of measurement of three-terminal characteristics of a compound semiconductor device according to a comparative example.

FIG. 5A is a diagram obtained by adopting the compound semiconductor device 1 in FIG. 1 as a comparative example and measuring three-terminal characteristics of the comparative example.

The horizontal axis in FIG. 5A indicates a source-drain voltage and the vertical axis therein indicates a drain current. This is also the case for FIG. 5B to be described later.

As illustrated in FIG. 5A, when comparing with the same gate voltage Vg, on-resistance and a maximum current in the case where the source-drain voltage is raised to 20 V (solid lines) are smaller than those in the case where the source-drain voltage is raised to 10 V (dotted lines), which indicates that current collapse phenomenon occurs.

Figure 5B:
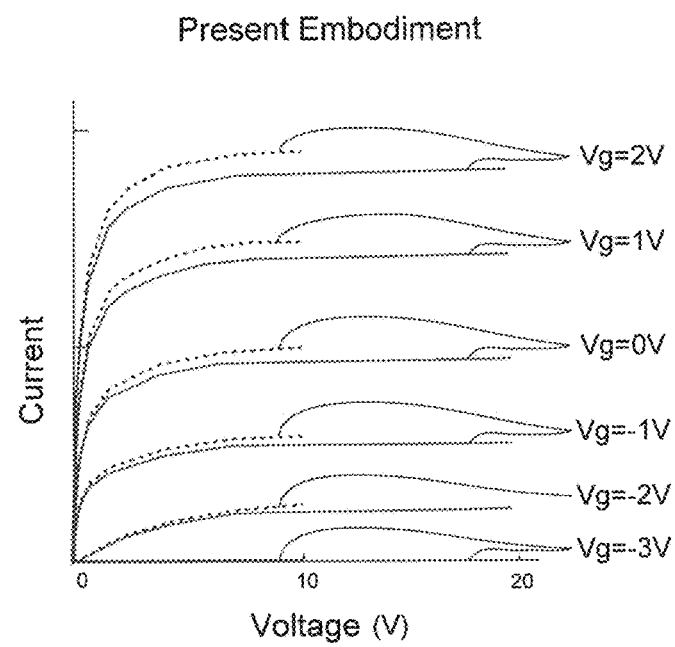
FIG. 5B is a graph illustrating a result of measurement of three-terminal characteristics of the compound semiconductor device according to the first embodiment.

Meanwhile, FIG. 5B is a diagram obtained by measuring three-terminal characteristics of the compound semiconductor device 50 of the present embodiment.

As illustrated in FIG. 5B, when comparing with the same gate voltage Vg, on-resistance and a maximum current in the case where the source-drain voltage is raised to 20 V (solid lines) are substantially equal to those in the case where the source-drain voltage is raised to 10 V (dotted lines) in the present embodiment, which indicates that the current collapse phenomenon is suppressed.

According to this result, it is confirmed that formation of the diffusion preventing layer 41 is effective for suppressing the current collapse phenomenon.

(Second Embodiment)

In the first embodiment, the cap layer 26 is formed on the barrier layer 25 so as to cause the cap layer 26 to prevent aluminum contained in the barrier layer 25 from being oxidized.

When oxidation of the barrier layer 25 does not matter, then the cap layer 26 may be omitted as described below.

FIGS. 6A to 6D are cross-sectional views in the process of manufacturing a compound semiconductor device of the present embodiment. Note that in FIGS. 6A to 6D, the same elements as those described in the first embodiment will be denoted by the same reference numerals as in the first embodiment, and their explanations will be omitted in the following.

Figure 6A:
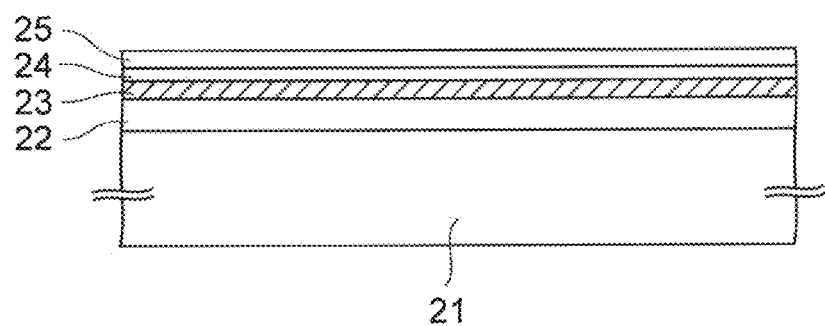
FIGS. 6A to 6D are cross-sectional views in the process of manufacturing a compound semiconductor device according to a second embodiment.

First, as illustrated in FIG. 6A, the buffer layer 22, the electron transit layer 23, the intermediate layer 24, and the barrier layer 25 are formed in this order on the substrate 21 by performing the processes described with reference to FIG. 3A in the first embodiment.

Note that the process of FIG. 3B is not carried out in the present embodiment, and the cap layer 26 is not formed on the barrier layer 25.

As with the first embodiment, the material of the barrier layer 25 is AlGaN, which contains aluminum as another III group element in addition to gallium. Here, an InAlGaN layer may be formed as the barrier layer 25 by adding indium of III group element to AlGaN in order to enhance the spontaneous polarization of the barrier layer 25.

In the meantime, the barrier layer 25 is an example of a compound semiconductor layer in the present embodiment.

Figure 6B:
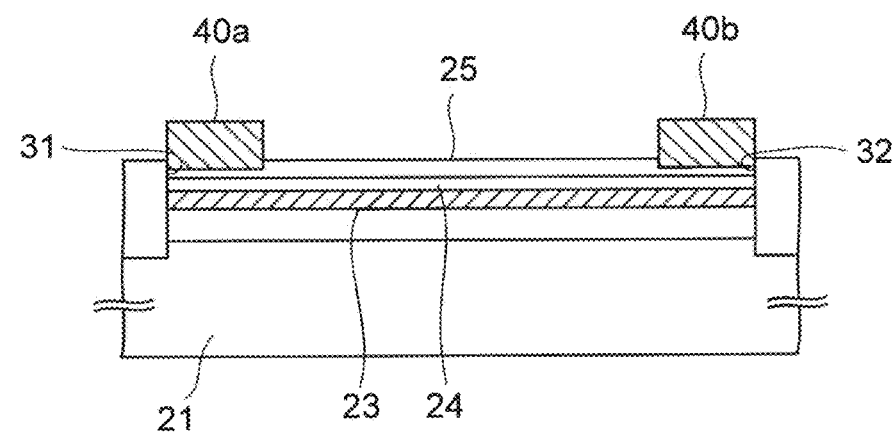

Then, as illustrated in FIG. 6B, a structure in which the source electrode 40a and the drain electrode 40b are formed at a distance from other on the electron transit layer 23 is obtained by carrying out the processes described with reference to FIGS. 3C to 3H in the first embodiment.

Figure 6C:
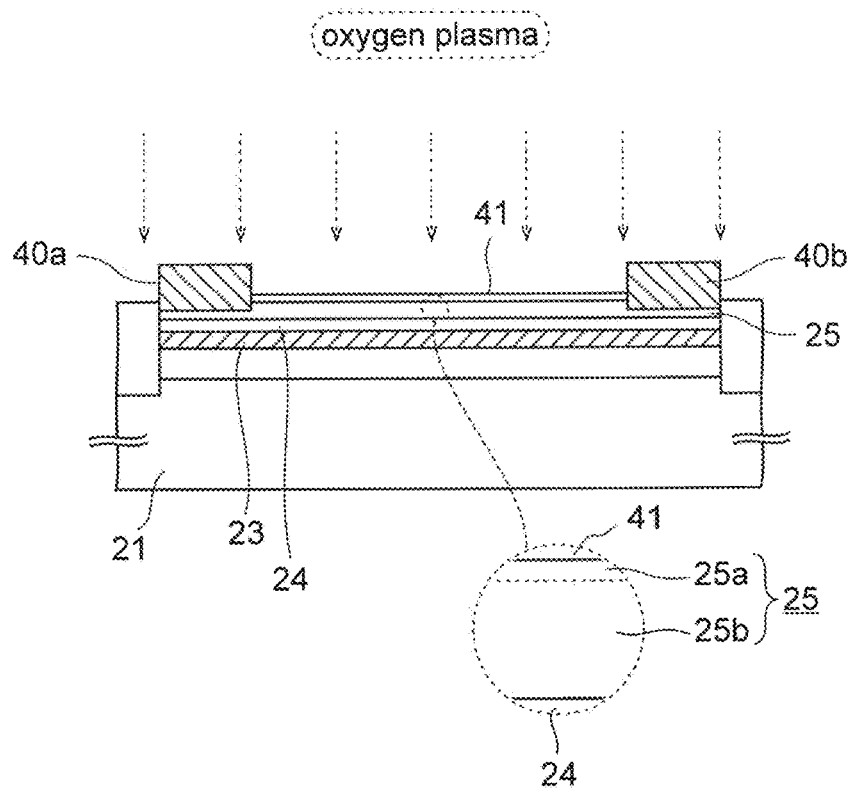

Next, as illustrated in FIG. 6C, the oxygen plasma is created in the asking chamber under the same conditions as the process in FIG. 3I in the first embodiment, and a surface of the barrier layer 25 is exposed to the oxygen plasma.

Thus, a surface layer of the AlGaN layer formed as the barrier layer 25 is oxidized, whereby a diffusion preventing layer 41 containing gallium oxide and aluminum oxide is formed to a thickness of about 1 nm to 2 nm.

At the time of the oxidation, the gallium atoms and the aluminum atoms in an upper layer 25a of the barrier layer 25 located close to the diffusion preventing layer 41 are consumed. As a consequence, the gallium atoms and the aluminum atoms becomes insufficient in the upper layer 25a, whereby respective composition ratios of gallium and aluminum in the upper layer 25a become smaller than those of a stoichiometric composition.

On the other hand, the gallium atoms and the aluminum atoms in a lower layer 25b of the barrier layer 25 are not consumed. Accordingly, the composition ratios of gallium and aluminum in the upper layer 25a become smaller than composition ratios of gallium and aluminum in the lower layer 25b, respectively.

Here, when the InAlGaN layer is formed as the barrier layer 25, the diffusion preventing layer 41 contains indium oxide as well. Then, due to the same reason as above, a composition ratio of indium in the upper layer 25a becomes smaller than a composition ratio of indium in the lower layer 25b.

Figure 6D:
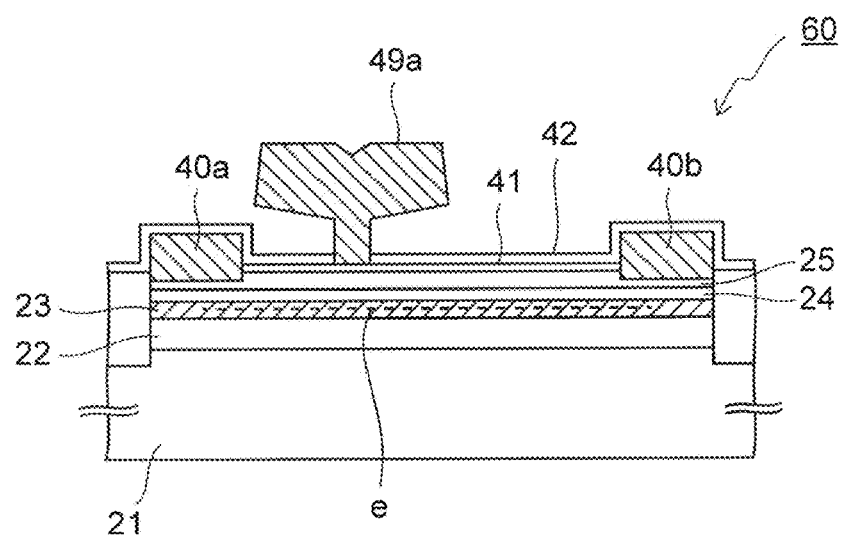

Thereafter, the processes in FIGS. 3J to 3N described in the first embodiment are carried out to obtain a basic structure of a compound semiconductor device 60 of the present embodiment illustrated in FIG. 6D.

In the compound semiconductor device 60, the two-dimensional electron gas e is generated as the carrier in the electron transit layer 23 due to piezoelectric polarization or spontaneous polarization of the barrier layer 25 as in the case of the first embodiment.

According to the above-described present embodiment, the diffusion preventing layer 41 containing gallium oxide and aluminum oxide is formed between the AlGaN barrier layer 25 and the silicon nitride insulation layer 42.

The bonding energy of the Al—O bonding in aluminum oxide is higher than that of the Ga—O bonding in gallium oxide. Therefore, the diffusion preventing layer 41 is stabilized more than the case of forming the gallium oxide layer as the diffusion preventing layer 41. Thus, it is possible to effectively inhibit the gallium atoms from being diffused into the insulation layer 42.

As a consequence, it is possible to prevent occurrence of the electron traps in the barrier layer 25 and the insulation layer 42 due to the diffusion of gallium atoms, and to prevent occurrence of the current collapse attributed to the electron traps.

The inventor of the present application observed the compound semiconductor device 60 with the TEM, in order to verify that the diffusion of gallium atoms is suppressed by the diffusion preventing layer 41 containing gallium oxide and aluminum oxide.

Figure 7:
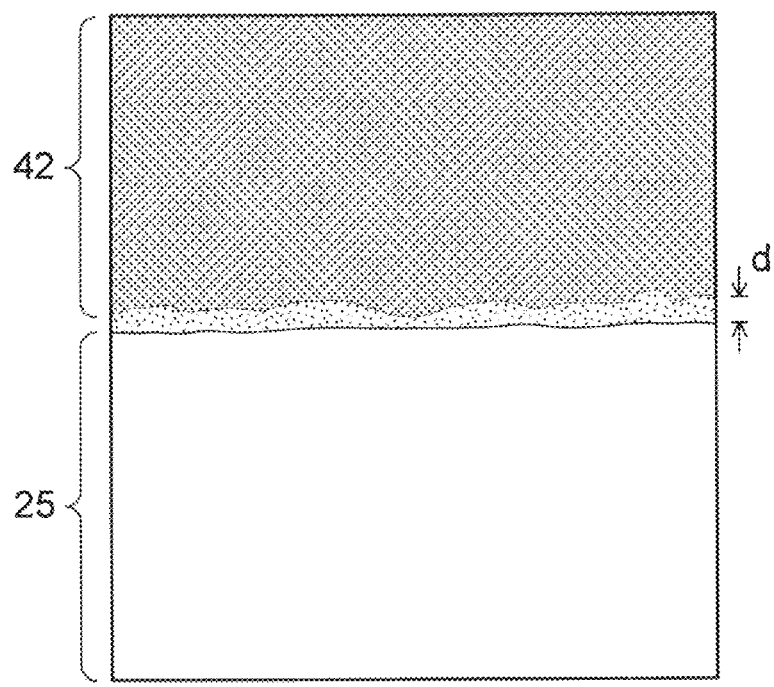
FIG. 7 is a diagram drawn on the basis of a TEM image of the compound semiconductor device according to the second embodiment.

FIG. 7 is a diagram drawn on the basis of the TEM image.

In this example, an interface between the barrier layer 25 and the insulation layer 42 was observed with the TEM.

As illustrated in FIG. 7, in the present embodiment as well, a boundary between the barrier layer 25 and the insulation layer 42 appears clearly. Thus, diffusion of the gallium atoms from the barrier layer 25 into the insulation layer 42 is suppressed. Note that similar to the first embodiment, a diffusion length d of the gallium atoms is equal to or below 2 nm.

By this result, it is confirmed that the diffusion preventing layer 41 of the present embodiment is effective for suppressing diffusion of the gallium atoms.

Meanwhile, the inventor of the present application measured three-terminal characteristics of the compound semiconductor device 60 of the present embodiment, in order to verify that the current collapse phenomenon is suppressed in the present embodiment.

A result of measurement will be described with reference to FIGS. 8A and 8B.

Figure 8A:
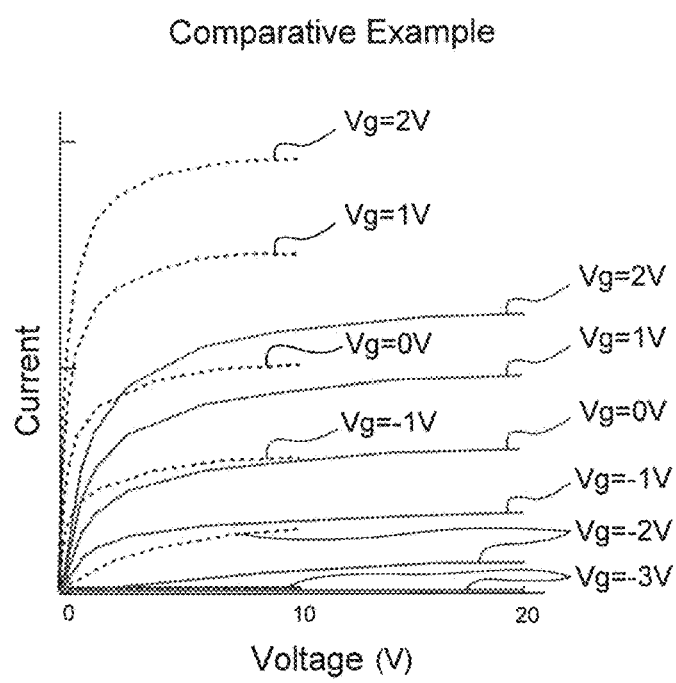
FIG. 8A is a graph illustrating the result of measurement of the three-terminal characteristics of the compound semiconductor device according to the comparative example.

FIG. 8A is a diagram obtained by adopting the compound semiconductor device 1 in FIG. 1 as the comparative example and measuring the three-terminal characteristics of the comparative example.

The horizontal axis in FIG. 8A indicates the source-drain voltage and the vertical axis therein indicates the drain current. This is also the case for FIG. 8B to be described later.

In the comparative example in FIG. 8A, the current collapse phenomenon occurs as explained with reference to FIG. 5A.

Figure 8B:
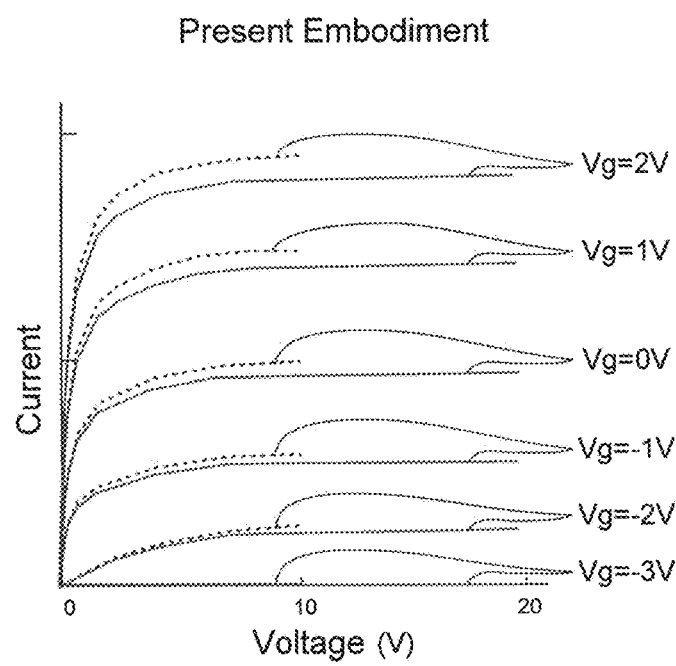
FIG. 8B is a graph illustrating a result of measurement of three-terminal characteristics of the compound semiconductor device according to the second embodiment.

Meanwhile, FIG. 8B is a diagram obtained by measuring three-terminal characteristics of the compound semiconductor device 60 of the present embodiment.

As illustrated in FIG. 8B, in the present embodiment, when comparing with the same gate voltage Vg, on-resistance and a maximum current in the case where the source-drain voltage is raised to 20 V (solid lines) are substantially equal to those in the case where the source-drain voltage is raised to 10 V (dotted lines), which indicates that the current collapse phenomenon is suppressed.

By this result, it was confirmed that the formation of the diffusion preventing layer 41 containing gallium oxide and aluminum oxide as in the present embodiment is effective for suppressing the current collapse phenomenon.

(Third Embodiment)

In this embodiment, a description will be given of a discrete package provided with the compound semiconductor devices 50 and 60 manufactured in the first and second embodiments.

Figure 9:
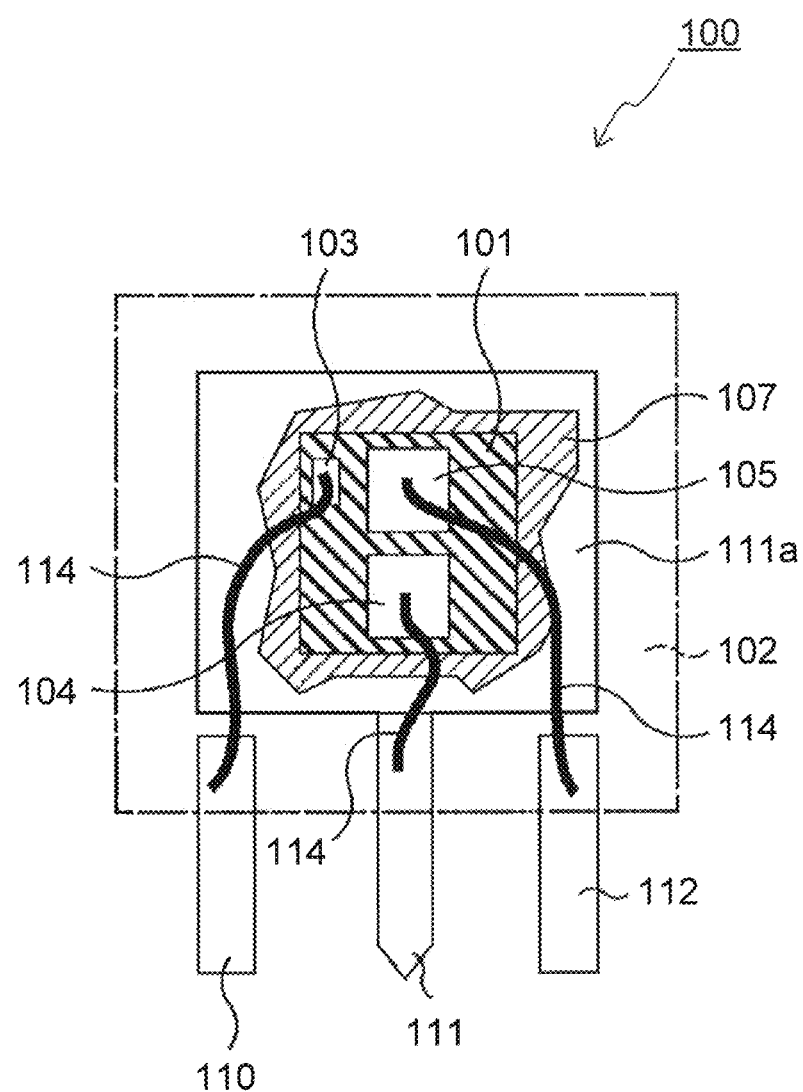
FIG. 9 is a plan view of a discrete package according to a third embodiment.

FIG. 9 is a plan view of the discrete package of the present embodiment.

This discrete package 100 includes a HEMT chip 101 including one of the compound semiconductor device 50 (see FIG. 3N) and the compound semiconductor device 60 (see FIG. 6D), and a resin 102 to seal the HEMT chip 101.

The HEMT chip 101 is provided with a gate pad 103, a drain pad 104, and a source pad 105. These pads are electrically connected to the gate electrode 49a, the drain electrode 40b, and the source electrode 40a, respectively, through unillustrated wires.

Moreover, a gate lead 110, a drain lead 111, and a source lead 112 are partially buried in the resin 102. Among them, the drain lead 111 is provided with a square-shaped land 111a, and the HEMT chip 101 is attached to the land 111a by using a die-attach material 107.

Then, the leads 110, 111, and 112 are electrically connected to the gate pad 103, the drain pad 104, and the source pad 105, respectively through metal wires 114 such as aluminum wires.

According to the present embodiment, the current collapse phenomenon hardly occurs in the HEMT chip 101. Therefore, it is possible to provide the discrete package 100 suitable for use in a high-power application.

(Fourth Embodiment)

In the present embodiment, a description will be given of a power factor correction (PFC) circuit using the HEMT chip 101 of the third embodiment.

Figure 10:
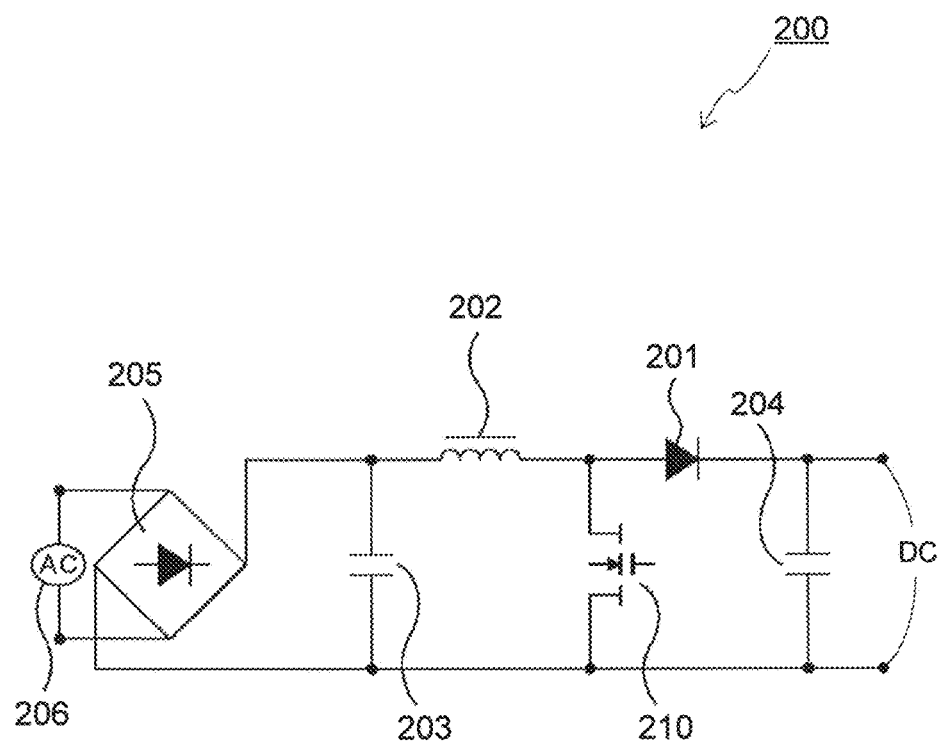
FIG. 10 is a circuit diagram of a PFC circuit according to a fourth embodiment.

FIG. 10 is a circuit diagram of the PFC circuit.

As illustrated in FIG. 10, a PFC circuit 200 includes a diode 201, a choke coil 202, capacitors 203 and 204, a diode bridge 205, an alternating-current power supply 206, and a switching element 210.

The HEMT chip 101 described in the third embodiment may be used for the switching element 210. A drain electrode of the switching element 210 is connected to an anode terminal of the diode 201 and to one of terminals of the choke coil 202.

Meanwhile, a source electrode of the switching element 210 is connected to one of terminals of the capacitor 203 and to one of terminals of the capacitor 204.

Here, an unillustrated gate driver is connected to a gate electrode of the switching element 210.

Moreover, the other terminal of the capacitor 203 is connected to the other terminal of the choke coil 202, and the other terminal of the capacitor 204 is connected to a cathode terminal of the diode 201.

Then, the alternating-current power supply 206 is connected between the terminals of the capacitor 203 through the diode bridge 205, while a direct-current power supply DC is connected between the terminals of the capacitor 204.

(Fifth Embodiment)

In the present embodiment, a description will be given of a power supply unit using the HEMT chip 101 of the third embodiment.

Figure 11:
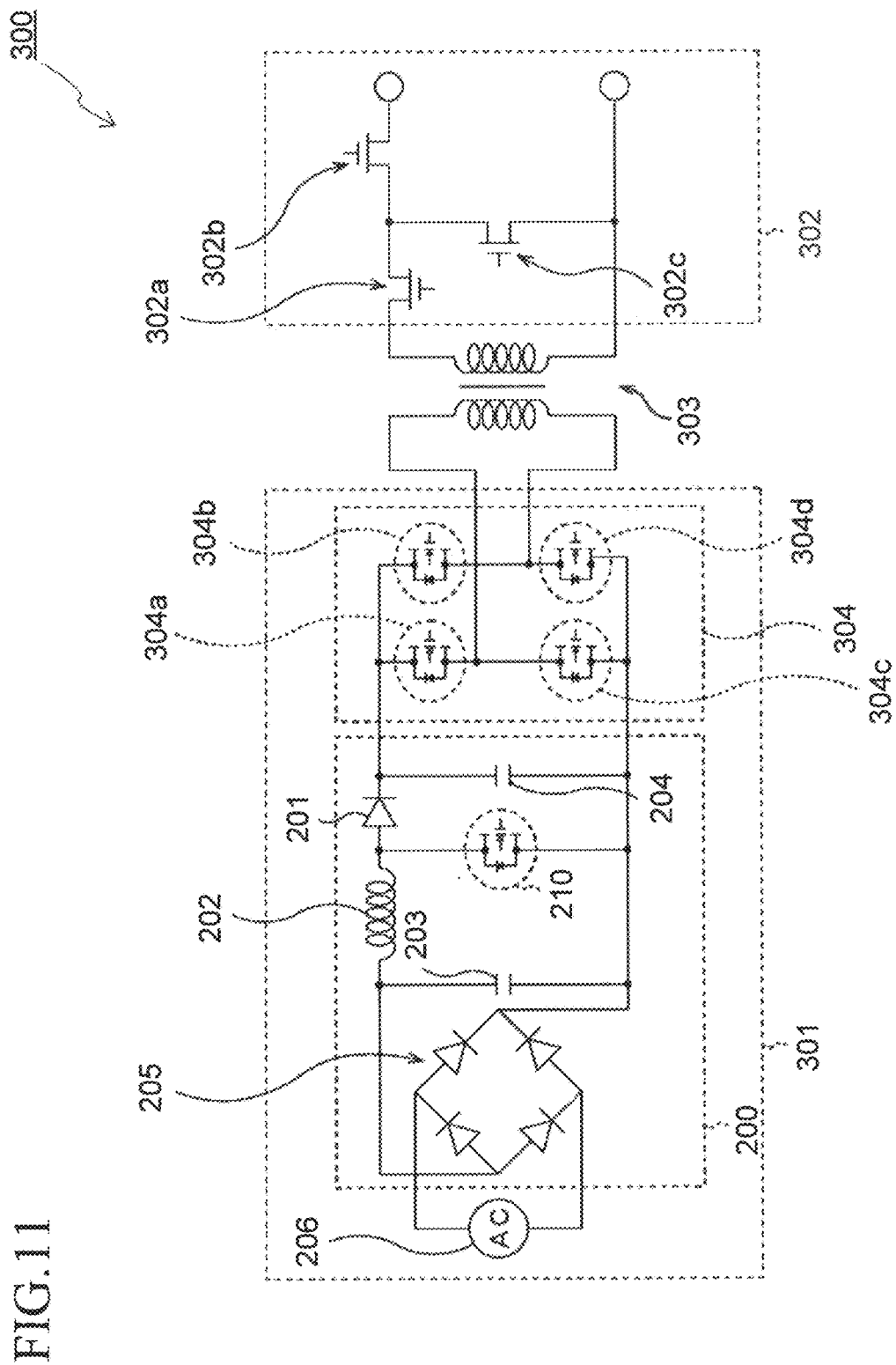
FIG. 11 is a circuit diagram of a power supply unit according to a fifth embodiment.

FIG. 11 is a circuit diagram of the power supply unit. Note that in FIG. 11, the same elements as those described in the fourth embodiment will be denoted by the same reference numerals as in the fourth embodiment, and explanations thereof will be omitted in the following.

As illustrated in FIG. 11, a power supply unit 300 includes a high-voltage primary circuit 301, a low-voltage secondary circuit 302, and a transformer 303 connected therebetween.

Among them, the primary circuit 301 is provided with the PFC circuit 200 described in the fourth embodiment, and a full bridge inverter circuit 304 connected between the terminals of the capacitor 204 in the PFC circuit 200.

The full bridge inverter circuit 304 includes four switching elements 304a, 304b, 304c, and 304d. The HEMT chip 101 described in the third embodiment may be used for each of the switching elements 304a, 304b, 304c, and 304d.

On the other hand, the secondary circuit 302 includes three switching elements 302a, 302b, and 302c. For example, each of the switching elements 302a, 302b, and 302c may adopt a metal insulator semiconductor field effect transistor (MISFET) in which a channel is formed on a silicon substrate.

According to the above-described embodiment, each of the switching elements 210, 304a, 304b, 304c, and 304d adopts the HEMT chip 101. Since the current collapse phenomenon hardly occurs in the HEMT chip 101, it is possible to provide the power supply unit 300 suitable for a high-frequency application.

(Sixth Embodiment)

In this embodiment, a description will be given of a high-frequency amplifier using the HEMT chip 101 of the third embodiment.

Figure 12:
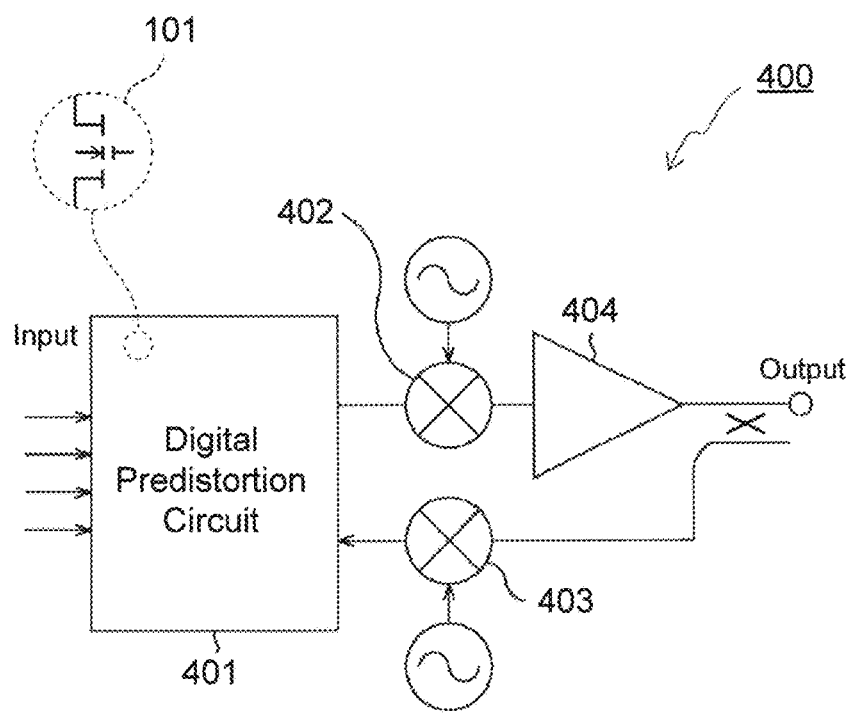
FIG. 12 is a circuit diagram of a high-frequency amplifier according to a sixth embodiment.

FIG. 12 is a circuit diagram of the high-frequency amplifier.

As illustrated in FIG. 12, a high-frequency amplifier 400 includes a digital predistortion circuit 401, mixers 402 and 403, and a power amplifier 404.

Among them, the digital predistortion circuit 401 compensates for non-linear distortion of an inputted signal. Meanwhile, the mixer 402 mixes the inputted signal subjected to compensation for the non-linear distortion with an alternating-current signal.

Meanwhile, the power amplifier 404 includes the above-described HEMT chip 101, and amplifies the inputted signal mixed with the alternating-current signal. Here, in the present embodiment, a signal on an output side can be mixed with the alternating-current signal with the mixer 403 by operating a switch, and the mixed signal thus obtained can be sent out to the digital predistortion circuit 401.

According to the present embodiment, the current collapse phenomenon hardly occurs in the HEMT chip 101 embedded in the power amplifier 404. Therefore, it is possible to provide the high-frequency amplifier 400 suitable for a high-power application.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device comprising:
a substrate;
an electron transit layer formed on the substrate;
a compound semiconductor layer containing gallium and formed on the electron transit layer;
a diffusion preventing layer containing gallium oxide and formed on the compound semiconductor layer;
an insulation layer formed on the diffusion preventing layer;
a source electrode, a drain electrode, and a gate electrode formed over the electron transit layer at a distance from one another; and
a barrier layer formed on the electron transit layer,
wherein the compound semiconductor layer is a cap layer of gallium nitride formed on the barrier layer, and
the cap layer includes:
an upper layer located close to the diffusion preventing layer; and
a lower layer located below the upper layer,
wherein a composition ratio of gallium in the upper layer is smaller than a composition ratio of gallium in the lower layer.

2. A power supply unit comprising:
the compound semiconductor device according to claim 1.

3. An amplifier comprising:
the compound semiconductor device according to claim 1.

4. A compound semiconductor device comprising:
a substrate;
an electron transit layer formed on the substrate;
a compound semiconductor layer containing gallium and formed on the electron transit layer;
a diffusion preventing layer containing gallium oxide and formed on the compound semiconductor layer;
an insulation layer formed on the diffusion preventing layer; and
a source electrode, a drain electrode, and a gate electrode formed over the electron transit layer at a distance from one another,
wherein the compound semiconductor layer is a barrier layer formed on the electron transit layer,
the barrier layer contains III group element other than the gallium,
the diffusion preventing layer contains an oxide of the III group element other than the gallium oxide, and
the barrier layer includes:
an upper layer located close to the diffusion preventing layer; and
a lower layer located below the upper layer,
wherein a composition ratio of the III group element in the upper layer is smaller than a composition ratio of the III group element in the lower layer.

5. The compound semiconductor device according to claim 4, wherein the III group element is aluminum, and
the barrier layer is an aluminum gallium nitride layer.

6. The compound semiconductor device according to claim 4, wherein the III group element includes aluminum and indium, and
the barrier layer is an aluminum gallium nitride layer to which indium is added.

7. A power supply unit comprising:
the compound semiconductor device according to claim 4.

8. An amplifier comprising:
the compound semiconductor device according to claim 4.

9. A method of manufacturing a compound semiconductor device, the method comprising:
forming an electron transit layer on a substrate;
forming a compound semiconductor layer containing gallium on the electron transit layer;
forming a diffusion preventing layer containing gallium oxide on the compound semiconductor layer;
forming an insulation layer on the diffusion preventing layer;
forming a source electrode, a drain electrode, and a gate electrode over the electron transit layer at a distance from one another; and
forming a barrier layer on the electron transit layer,
wherein the compound semiconductor layer is a cap layer of gallium nitride formed on the barrier layer, and
the cap layer includes:
an upper layer located close to the diffusion preventing layer; and
a lower layer located below the upper layer,
wherein a composition ratio of gallium in the upper layer is smaller than a composition ratio of gallium in the lower layer.

10. The method of manufacturing a compound semiconductor device according to claim 9, wherein
the forming of the diffusion preventing layer is performed by oxidizing the compound semiconductor layer.

11. A method of manufacturing a compound semiconductor device, the method comprising:
forming an electron transit layer on a substrate;
forming a compound semiconductor layer containing gallium on the electron transit layer;
forming a diffusion preventing layer containing gallium oxide on the compound semiconductor layer;
forming an insulation layer on the diffusion preventing layer; and
forming a source electrode, a drain electrode, and a gate electrode over the electron transit layer at a distance from one another,
wherein the compound semiconductor layer is a barrier layer formed on the electron transit layer,
the barrier layer contains III group element other than the gallium,
the diffusion preventing layer contains an oxide of the III group element other than the gallium oxide, and
the barrier layer includes:
an upper layer located close to the diffusion preventing layer; and
a lower layer located below the upper layer,
wherein a composition ratio of the III group element in the upper layer is smaller than a composition ratio of the III group element in the lower layer.

* * * * *